United States Patent
Cao et al.

(10) Patent No.: US 8,056,028 B2
(45) Date of Patent: Nov. 8, 2011

(54) METHOD OF PERFORMING MASK-WRITER TUNING AND OPTIMIZATION

(75) Inventors: Yu Cao, Cupertino, CA (US); James Norman Wiley, Menlo Park, CA (US); Jun Ye, Palo Alto, CA (US)

(73) Assignee: ASML Netherlands B.V., Veldhoven (NL)

( * ) Notice: Subject to any disclaimer, the term of this patent is extended or adjusted under 35 U.S.C. 154(b) by 398 days.

(21) Appl. No.: 12/417,559

(22) Filed: Apr. 2, 2009

(65) Prior Publication Data

US 2009/0276751 A1     Nov. 5, 2009

Related U.S. Application Data

(60) Provisional application No. 61/044,658, filed on Apr. 14, 2008.

(51) Int. Cl.
*G06F 17/50* (2006.01)

(52) U.S. Cl. .................. 716/55; 716/50; 716/51; 716/54

(58) Field of Classification Search .................... 716/50, 716/51, 54, 55
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,523,193 A | 6/1996 | Nelson | |
| 5,969,441 A | 10/1999 | Loopstra et al. | |
| 6,046,792 A | 4/2000 | Van Der Werf et al. | |
| 6,801,297 B2 | 10/2004 | Nakae | |
| 7,242,459 B2 | 7/2007 | Shi et al. | |
| 7,266,800 B2 * | 9/2007 | Sezginer | 716/52 |
| 7,346,882 B2 | 3/2008 | Abe | |
| 7,444,615 B2 * | 10/2008 | Percin et al. | 716/52 |
| 7,689,966 B2 | 3/2010 | Verma et al. | |
| 2003/0026472 A1 | 2/2003 | Abe | |
| 2004/0008329 A1 | 1/2004 | Nakae | |
| 2006/0062445 A1 | 3/2006 | Verma et al. | |
| 2006/0266243 A1 * | 11/2006 | Percin et al. | 101/484 |
| 2007/0247610 A1 | 10/2007 | Shi et al. | |

(Continued)

FOREIGN PATENT DOCUMENTS

JP     2003-043661     2/2003

(Continued)

OTHER PUBLICATIONS

Japanese Office Action mailed May 18, 2011 in corresponding Japanese Patent Application No. 2009-092538.

*Primary Examiner* — Sun Lin
(74) *Attorney, Agent, or Firm* — Pillsbury Winthrop Shaw Pittman LLP (57) ABSTRACT

A model-based tuning method for tuning a first mask writer unit utilizing a reference mask writer unit, each of which has tunable parameters for controlling mask writing performance. The method includes the steps of defining a test pattern and a mask writing model; generating the test pattern utilizing the reference mask writer unit and measuring the mask writing results; generating the test pattern utilizing the first mask writer unit and measuring the mask writing results; calibrating the mask writing model utilizing the mask writing results corresponding to the reference mask writer unit, where the calibrated mask writing model has a first set of parameter values; tuning the calibrated mask writing model utilizing the mask writing results corresponding to the first mask writer unit, where the tuned calibrated model has a second set of parameter values; and adjusting the parameters of the first mask writer unit based on a difference between the first set of parameter values and the second set of parameter values.

10 Claims, 8 Drawing Sheets

U.S. PATENT DOCUMENTS

2009/0053628 A1 2/2009 Ye et al.
2009/0276736 A1* 11/2009 Mansfield et al. ............... 716/4

FOREIGN PATENT DOCUMENTS

| JP | 2003-059787 | 2/2003 |
| JP | 2004-047755 | 2/2004 |
| JP | 2004-103674 | 4/2004 |
| JP | 2005-217430 | 8/2005 |
| JP | 2006-501525 T | 1/2006 |
| JP | 2006-085175 | 3/2006 |
| JP | 2009-049412 | 3/2009 |
| WO | 2004/032000 | 4/2004 |

* cited by examiner

METHOD OF PERFORMING MASK-WRITER TUNING AND OPTIMIZATION

CROSS-REFERENCE TO RELATED APPLICATIONS

This application claims priority to U.S. Provisional Application No. 61/044,658 filed Apr. 14, 2008.

TECHNICAL FIELD

The technical field of the present invention relates generally to a method and program product for performing model-based mask-writer tuning and optimization so as to allow for optimization of performance of multiple mask writing systems.

BACKGROUND

Lithographic apparatus can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations could be referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the wafer (via the mask).

An important aspect to be considered in the overall photolithography process is the ability of the mask writing apparatus (referred to herein as a mask-writer) to accurately produce the target mask design. In other words, the ability to transform the target mask design into a mask that can be utilized in the actual imaging process. Known mask writer devices or units include e-beam mask writers and optical mask writers, each of which have different underlying imaging physics and different variable parameters which affect the results of the mask writing process. For example, e-beam mask writers have parameters such as, but not limited to, beam size, focus, beam dose, beam current, beam energy, acceleration voltage, and beam blur and, parameters to correct for proximity effects caused by, for example, back-scattered electrons, fogging affects and pattern dependent processing steps such as etching. Optical mask writers have parameters, such as, but not limited to, numerical aperture (NA), focus, illumination shape and dose. In each instance, some of the parameters of the given mask-writer are fixed and some are tunable. The tunable parameters of the given mask writer unit can be adjusted in an effort to improve the results of the mask writing process.

Another goal is to be able to utilize different mask-writer units to produce the same target mask for imaging a desired pattern without having to expend considerable amounts of time and resources determining the necessary settings of each mask writer unit to achieve optimal/acceptable performance. As is known, designers/engineers spend a considerable amount of time and money determining the optimal settings of a given mask writer unit when initially setting up the given mask writer unit so that the resulting mask satisfies the design requirements. Indeed, this is often a trial and error process wherein the tunable parameters on the mask writer unit are selected and the mask generated and then analyzed to determine if the resulting mask is within specified error tolerances. If not, the tunable parameters are adjusted and the mask is generated and analyzed again. This process is repeated until the resulting mask is within the specified error tolerances.

However, as each mask writer unit, even identical model types, exhibit for example different proximity effects when generating a mask, the actual mask which is generated often differs from mask writer unit to mask writer unit. For example, different optical proximity effects (OPEs) associated with given optical mask writer units can introduce significant CD variations through pitch. As such, it is not possible to simply utilize any mask writer unit to generate a given mask, as the resulting mask can vary considerable. Thus, if it is desirable to utilize a different mask writer unit to form a given mask, the engineers must optimize or tune the new mask writer unit, so that the resulting mask formed by the mask writer unit satisfies the design requirements. Currently, this is typically accomplished by a trial and error process, which as noted above, is both expensive and time consuming.

As such, there is a need for a method for tuning or optimizing a given mask writer unit that allows the mask writer unit to produce a mask within a specified error tolerance relative to a previously tuned mask writer unit such that both mask writers are effectively capable of producing the same mask. In other words, there is a need for a method for optimizing the performance of multiple mask writers with respect to a given target mask that does not require a trial and error optimization process and which allows all mask writer units to produce masks within a predefined error tolerance.

SUMMARY

Accordingly, the present invention relates to a method for tuning mask writer units so as to allow different mask writer units to produce the same mask without requiring a substantial trial and error process to be performed to optimize the tunable parameters of each individual mask writer unit.

More specifically, the present invention relates to a model-based tuning method for tuning a first mask writer unit utilizing a reference mask writer unit, each of which has tunable parameters for controlling mask writing performance. The method includes the steps of defining a test pattern and a mask writing model; generating the test pattern utilizing the reference mask writer unit and measuring the mask writing results; generating the test pattern utilizing the first mask writer unit and measuring the mask writing results; calibrating the mask writing model utilizing the mask writing results corresponding to the reference mask writer unit, where the calibrated mask writing model has a first set of parameter values; tuning the calibrated mask writing model utilizing the mask writing results corresponding to the first mask writer unit, where the tuned calibrated model has a second set of parameter values; and adjusting the parameters of the first mask writer unit based on a difference between the first set of parameter values and the second set of parameter values.

The present invention also relates to a method of tuning a mask writer unit utilizing a mask writing model, where both the mask writer unit and the mask writing model each have tunable parameters for controlling mask writing performance. The method includes the steps of defining a test pattern; generating the test pattern utilizing the mask writer unit and measuring the mask writing results, where the mask writer unit has a first set of parameter values; tuning the mask writing model utilizing the mask writing results corresponding to the mask writer unit, the tuned mask writing model having a second set of parameter values; adjusting the first set of parameters of the mask writer unit based on a difference between the first set of parameter values and the second set of parameter values.

The model-based mask writer tuning process discussed herein provides numerous advantages over prior art methods. Most importantly, the present invention provides a systematic and cost effective method for the optimization of mask writing performance and mask proximity effect "MPE" matching between different mask writer units, which are being utilized to generate the same mask. As a result, the present invention readily allows performance matching between different mask writers of the same model as well as for performance matching between different model mask writers.

Additional advantages of the present invention will become apparent to those skilled in the art from the following detailed description of exemplary embodiments of the present invention.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

a programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. No. 5,296,891 and U.S. Pat. No. 5,523,193, which are incorporated herein by reference.

a programmable LCD array. An example of such a construction is given in U.S. Pat. No. 5,229,872, which is incorporated herein by reference.

The invention itself, together with further objects and advantages, can be better understood by reference to the following detailed description and the accompanying schematic drawings.

DESCRIPTION

Figure 1:
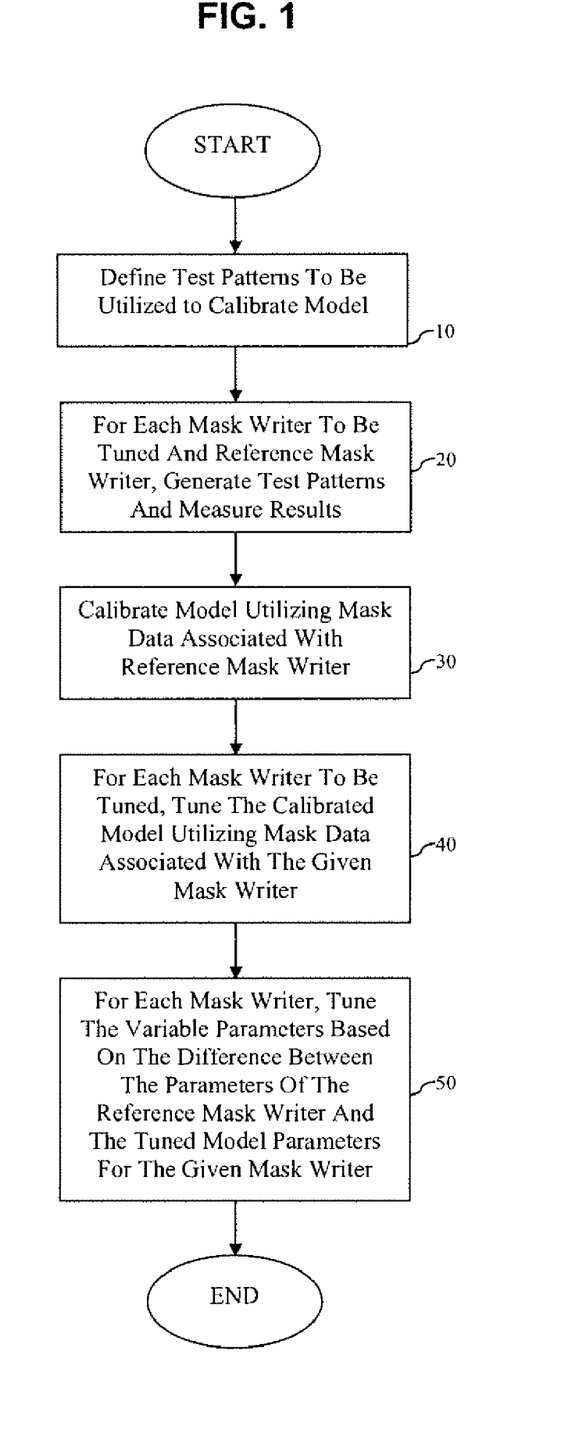
FIG. 1 is an exemplary flowchart illustrating the method of the present invention.

FIG. 1 is an exemplary flowchart illustrating the mask-writer tuning method of the present invention. As explained in detailed below, the method of the present invention allows for the matching or tuning of the performance between different mask writer units, as well as the tuning of a mask writer to a virtual mask writer or a desired performance. In the first scenario, the matching or tuning of different mask writer units provides in-part for the matching of the mask proximity effects associated with each mask writer unit such that the resulting performance of the two different mask writer units is substantially similar (and preferably within some predefined error tolerance). In the second scenario, the desired behavior would be defined/described by the virtual mask writer, and the mask writer unit is tuned to have substantially similar performance as the virtual mask writer.

Referring to FIG. 1, the first step (Step 10) in the process is to define the test patterns that are to be utilized to calibrate the model for a reference mask writer unit (also referred to as the "to-be-matched to mask writer"). A suitable test pattern (also referred to as gauge patterns) may be utilized. The gauge pattern may include, but is not limited to, through-pitch data of various CDs, and various 2-dimensional patterns (e.g., line ends, contacts). The objective is to select a set of gauge patterns that represent the pattern space that the mask writer will be expected to produce accurately. In others words, the gauge patterns should sufficiently represent the features the mask writer will be expected to produce so that a robust model capable of accurately predicting writing performance of the mask writer unit may be generated. It is further noted that the test patterns for calibration can be designed so as to target different physical effects at different length scales, such as but not limited to, forward scattering, backward scattering, fogging, as well as resist development effects and etch effects. Such test/gauge patterns can be readily generated/selected by those of skill in the art once the target pattern or application is determined.

Once the test pattern is defined, in the next step (Step 20) each mask writer unit to be tuned (including the reference mask writer unit) writes the test pattern and the mask writing results are measured. When writing the test pattern, the parameters, P, of each mask writer is set at a predefined nominal value, which is chosen during the initial set-up. Preferably, the same nominal value for each parameter is utilized for each mask writer during the writing of the test pattern. Next, the resulting masks generated by each of the mask writers are measured so as to obtain mask data indicative of the writing performance of the given mask writer. For the purposes of facilitating the following explanation, the measured mask data (MD) is designated MD_1, MD_2 . . . MD_n, where MD_1 corresponds to the mask data generated by the first mask writer, MD_2 corresponds to the mask data generated by the second mask writer and so on up to the nth mask writer. It is noted the measurement of the mask data may be made, for example, by performing various CD measurements or measuring portions or the entire contour of the imaged feature which can be performed utilizing a SEM. Typically, the necessary measurements of the mask data will be defined by the model being utilized to represent the mask writing process, in addition to the overall design rules.

Once the mask data is measured, the next step (Step 30) is to calibrate the mask writing model utilizing the mask data associated with the reference mask writer unit. The model parameters associated with the reference mask writer are designated MP_R, and include tunable and non-tunable parameters. As is known, during the calibration process (which is an iterative process), the non-tunable parameters are fixed and the tunable parameters are adjusted until the mask generated by the model (i.e., the simulated mask result) matches the actual mask result produced by the reference mask writer. Thus, the model parameters MP_R are adjusted (i.e., calibrated) such that the mask results produced by the model equal the actual mask data associated with the reference mask writer MD_R within some predefined error criteria or the best match possible. It is noted that any suitable model for simulating the mask writing performance of a mask writer unit may be utilized in this process. It is further noted that any one of the mask writers to be tuned and the associated mask data, MD_1 . . . MD-n, may be utilized to calibrate the model (i.e., may be utilized as the referenced mask writer). As another alternative, it is possible to average the mask data for each of the mask writers (MD_1 . . . MD-n) for each necessary measurement to be input into the model, and utilize these average values as the reference mask data utilized to calibrate the model parameters MP_R.

As an illustrative, but non-limiting example, one suitable model is represented by:

$$R = \Box MG + \Box MM3 + CR(\text{inner}) + CR(\text{outer}),$$

where M denotes the rendered mask image and G denotes a Gaussian function. " " is the convolution operation. This model includes three kinds of terms. The first term is a summation over multiple Gaussian-convolutions with sigma values in the range of short to mid-range interactions on the mask. These terms are sensitive to pattern density in these ranges. The second term is a summation of multiple terms that are sensitive to edge density. The third term is two CR terms that control inner- and outer-corner rounding. For an arbitrary mask layout, the foregoing model can be evaluated on a pixel grid. The mask contour is determined where R is equal to a constant threshold. It is noted that the foregoing model has achieved model accuracy of $3\sigma < 3$ nm (mask scale) for 1D patterns on several 65 nm and 45 nm masks manufactured with different processes. On 2D patterns, model error $3\sigma$ is typically about 10 nm for both calibration and prediction.

The mask model is calibrated from a few hundred CD measurements of 1D and 2D patterns of known target geometry on a test mask. SEM images can also be used together with the CD measurements. The 1D patterns have dense and isolated line/space, and others, with feature dimensions on mask ranging from 100 nm to 2 um. The 2D patterns include hammer heads, corners, and others, of different dimensions.

In the next step (Step 40), for each mask writer to be tuned, the model calibrated in the previous step having parameters MP_R is tuned in accordance with the mask data MD_i associated with the given mask writer (i.e., mask writer i). More specifically, utilizing model parameters MP_R as a start point, the non-tunable parameters of MP_R remain fixed and the variable or tunable parameters in MP_R are tuned so that the model for the given mask writer, MP_Ri, produces a mask result which is the same as the actual mask data MD_i associated with the given mask writer (i) within some predefined error criteria or the best match possible. This step is a standard calibration step, which is an iterative process in which the variable model parameters in MP_Ri are adjusted until the output of the mask writing model corresponds to the desired mask (MD_i). Step 40 is performed for each mask writer to be tuned.

Once the model MP_R is tuned for each of the mask writers, thereby creating "n" models MP_R1 ... MP_Rn (where n is the number of mask writers), in Step 50, each of the mask writers is tuned from the nominal parameter values that were utilized to generate the initial wafer data MD_1 ... MD_n utilizing the parameter values of the reference model MP_R and the adjusted model parameters MP_Ri. More specifically, the parameters Pi of each mask writer are tuned in accordance with the following equation:

$$Pi = Pi(\text{nominal}) + MP\_R - MP\_Ri,$$

where Pi (nominal) corresponds to the nominal parameters utilized to generate the initial mask data MD_i; MP_R corresponds to parameters of the calibrated model for the reference mask writer, and MP_Ri corresponds to parameters of the calibrated model for the mask writer (i). The resulting parameters, Pi, are then utilized to tune the corresponding mask writer (i).

It is noted that in the foregoing process, only like parameters are subtracted from one another when executing the foregoing equation. For example, assuming the tunable parameters are (T1, T2 ... Tm), and their values for the reference model are (T1r, T2r ... Tmr), and for mask writer (i) are (T1i, T2i ... Tmi), the nominal values, Pi, of these parameters are tuned by a delta equal to (T1r–T1i, T2r–T2i ... Tmr–Tmi). By performing the foregoing operation it is possible to reduce/minimize the difference between the models such that the two mask writers perform in the substantially same manner. Thus, the foregoing process provides a systematic process which allows for the matching of similar mask writers (same type and model of machines) as well as for matching the mask writing performance of different mask writers (i.e., different models and/or manufacturer). It is noted that the tunable parameters may include, but are not limited to, parameters associated with back-scatter correction, pattern dependent etch loading, fogging affects, average exposure, focus and current density. The fixed parameters include, for example, but are not limited to, acceleration voltage and illumination type. It is noted that the aforementioned tunable and fixed parameters are related to ebeam writers. However, optical writers also have tunable and non-tunable parameters.

Figure 2:
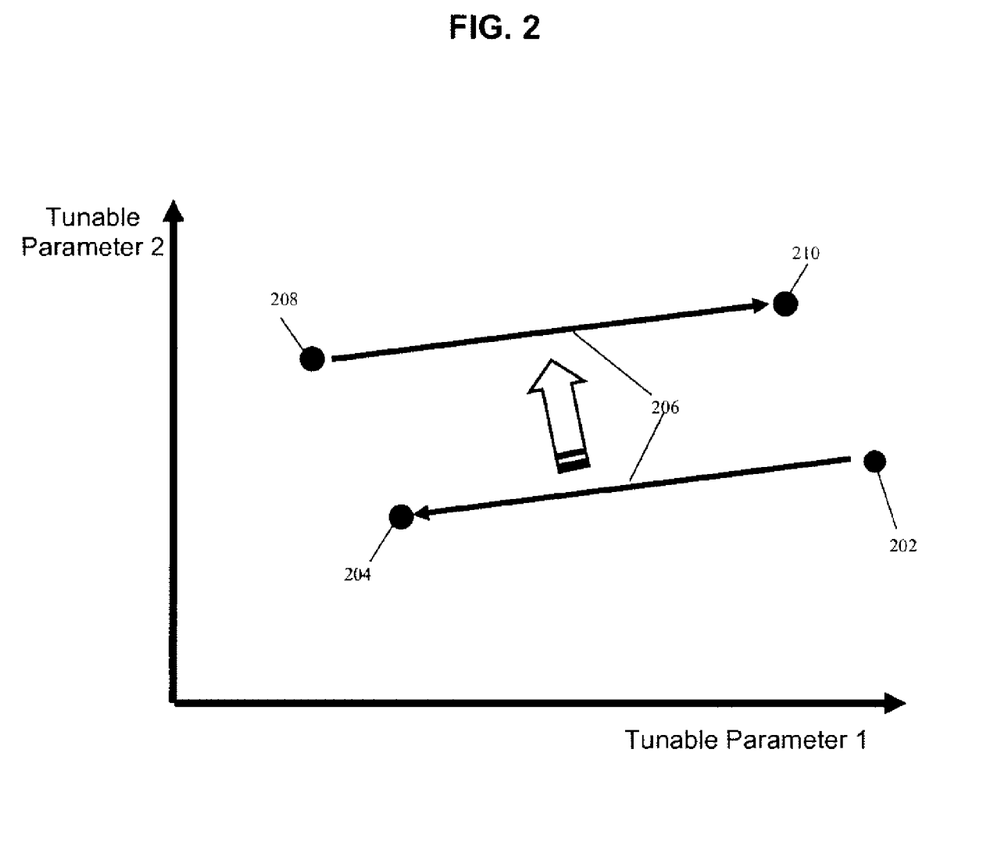
FIG. 2 illustrates a graphical representation of the process set forth in FIG. 1.
Figure 3:
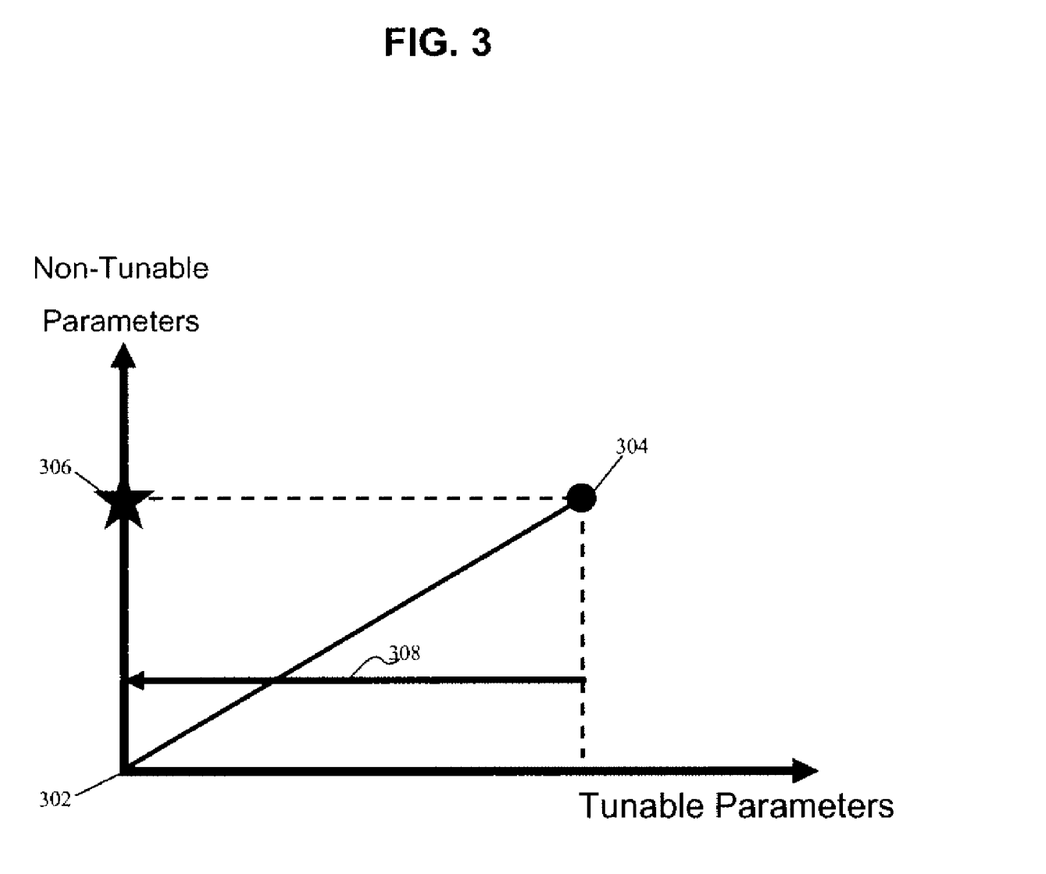
FIG. 3 is a first graphical representation of the space spanned by the tunable and non-tunable parameters of the mask writing model illustrating the example where the tunable parameters have an orthogonal affect on the non-tunable parameters.
Figure 4:
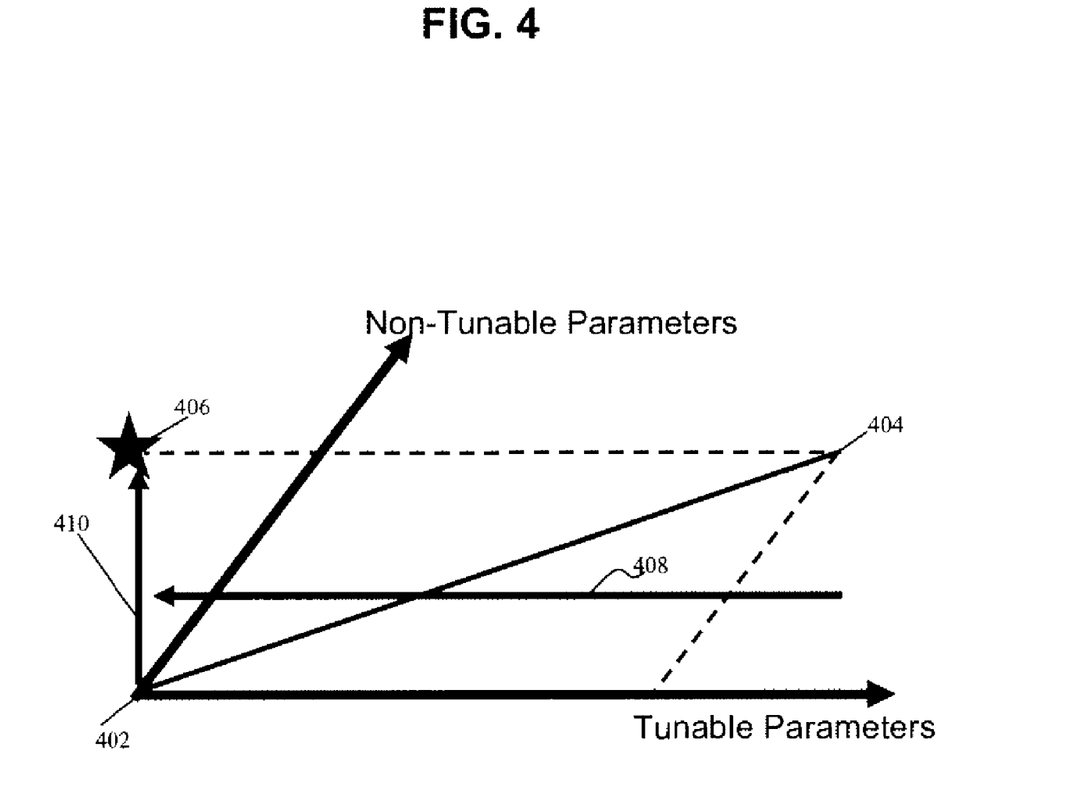
FIG. 4 is a second graphical representation of the space spanned by the tunable and non-tunable parameters of the mask writing model illustrating the example where the tunable parameters do not have an orthogonal affect on the non-tunable parameters.

FIG. 2 illustrates a graphical representation of the foregoing process. As shown in FIG. 2, the process effectively computes the difference between two virtual mask writers (MP_R and MP_Ri) based on parameters associated with the two virtual mask writers (MP_R parameters 202 and MP_Ri parameters 204), and then utilizes this computed difference 206 to tune the actual mask writers by adjusting parameters 208 for an actual mask writer to parameter 210. FIGS. 3 and 4 are graphical representations of the space spanned by the tunable and non-tunable parameters. FIG. 3 illustrates the example where the tunable parameters have an orthogonal effect on the non-tunable parameters. In FIG. 3, data point 302 represents the goal, data point 304 represents the parameters before tuning, data pint 306 represents the parameters after tuning, and 308 represents the tuned amount. FIG. 4 illustrates an example where the tunable parameters do not have an orthogonal effect on the non-tunable parameters. In FIG. 4, data point 402 represents the goal, data point 404 represents the parameters before tuning, data point 406 represents the parameters after turning, 408 represents the tuned amount, and 410 represents the residual error. As shown, any residual errors are orthogonal to the space spanned by the tunable parameters. In the case where the affects from tunable and non-tunable parameters are not orthogonal, it is possible to compensate to some degree the differences caused by the non-tunable parameters, through tuning the value of the tunable parameters.

Figure 5:
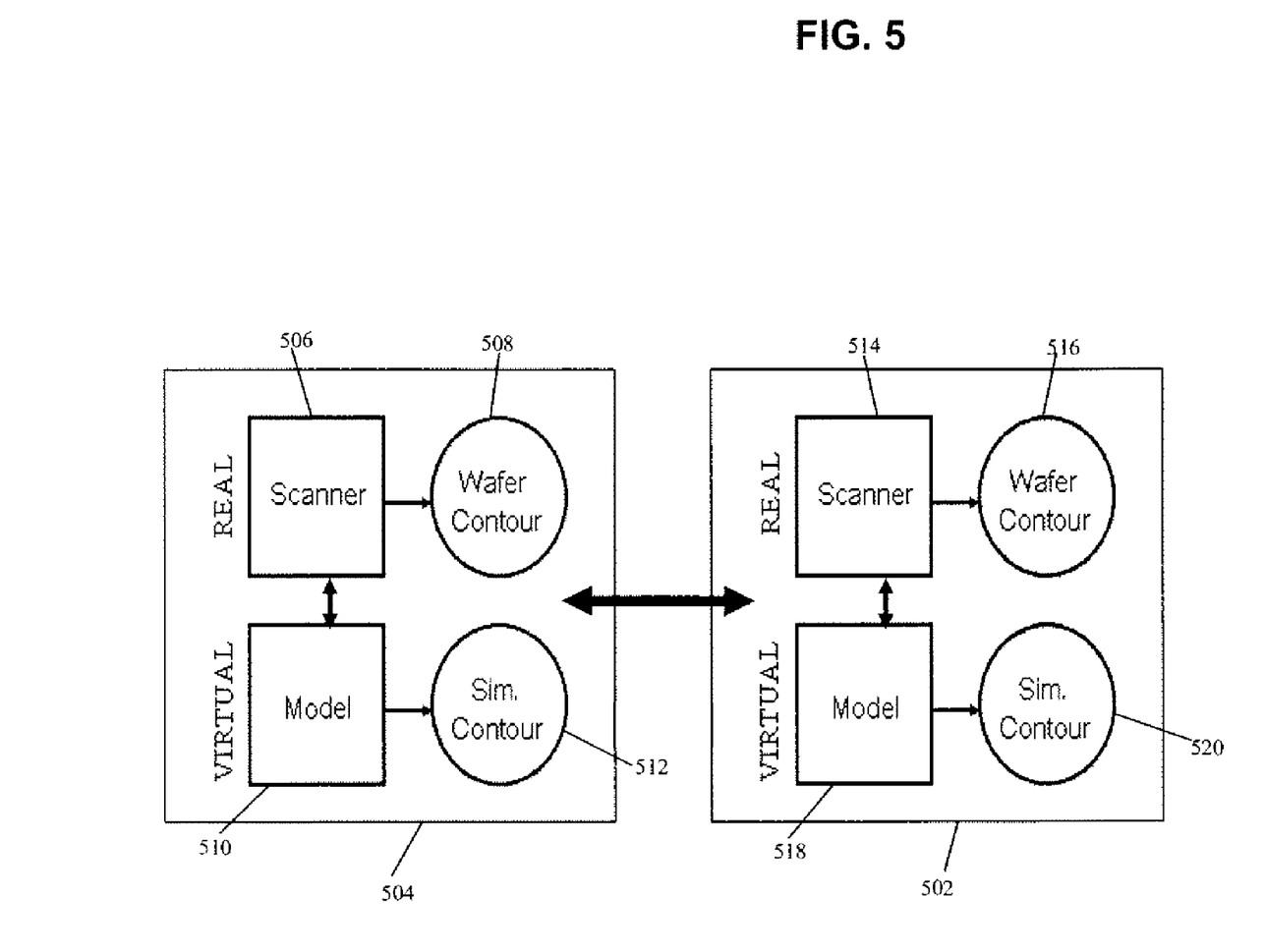
FIG. 5 is a block diagram graphically illustrating the components involved in the model-based mask writer tuning process of the present invention.

FIG. 5 is a block diagram graphically illustrating the components involved in the model-based mask writer tuning process of the present invention. As shown, the components include a tuning target 502 and a mask writer 504 to be tuned. As is clear from the foregoing, while there is always at least one mask writer to be tuned, it is possible that there would be multiple mask writer to be tuned. In the given embodiment, the mask writer to be tuned is a physical mask writer (i.e., an actual device). However, as explained in further detailed below, the tuning target may also be a virtual mask writer or desired behavior. Mask writer 504 may comprise a real device that in turn comprises scanner 506 and wafer contour 508 and/or a virtual device that in turn comprises model 510 and simulation contour 512. Similarly, turning target 502 may comprise a real device that in turn comprises scanner 514 and wafer contour 516 and/or a virtual device that in turn comprises model 518 and simulation contour 520. As detailed above, the tuning amount is the difference between the performance (i.e., model) of the mask writer to be tuned and the performance (i.e., model) of the tuning target. In the model-based tuning process disclosed herein, the model (i.e., virtual mask writer) provides the link between the tuning target and the mask writer to be tuned.

As noted, it is possible to utilize at least two different tuning targets in the foregoing process. The two possibilities are a physical mask writer unit, and a virtual mask writer unit or model. Examples of the use of the two different tuning targets are described below. The first option is to utilize a physical mask writer as the tuning target. A physical mask writer was utilized in the example detailed above. Utilizing a physical mask writer as the tuning target provides for proximity effect (PE) matching between mask writer units. In addition, it allows for matching between like mask writer units (e.g., SN1 ... SNn), where SN represents the same mask writer model. It also allows for matching between different mask writer types from the same manufacturer, as well as for matching between mask writers from different manufacturers.

Figure 6:
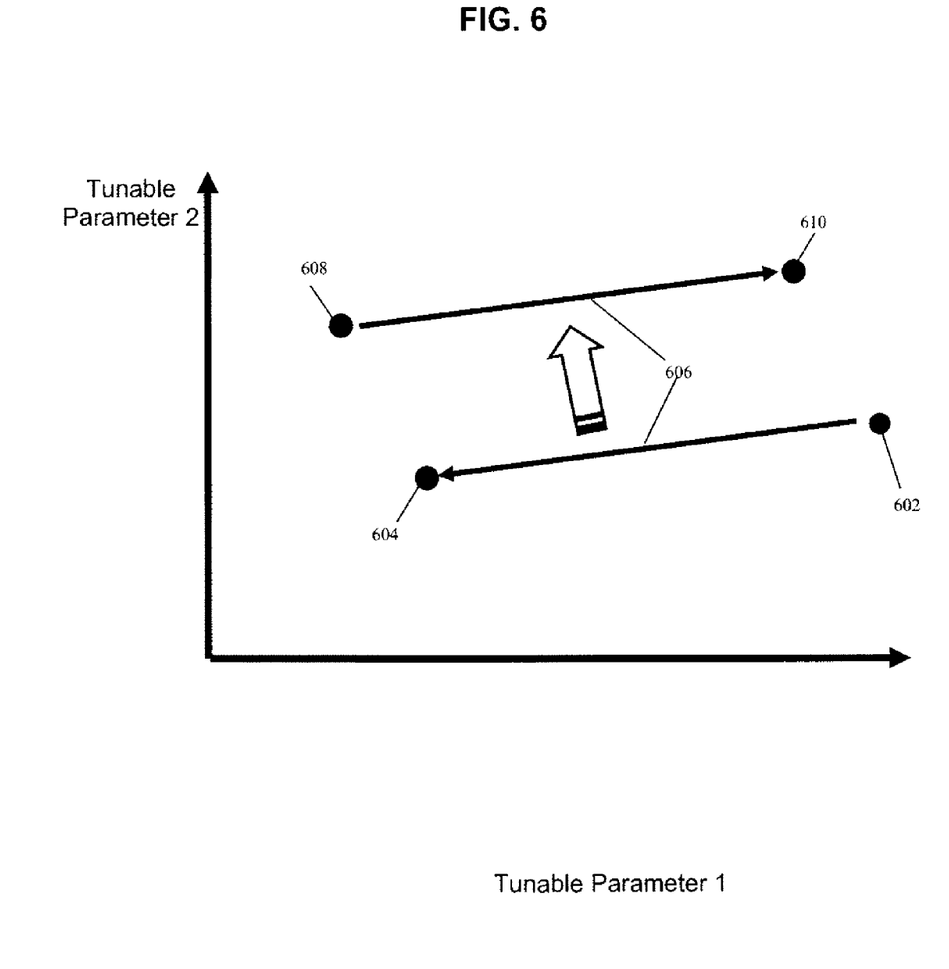
FIG. 6 illustrates a graphical representation of another example of the first embodiment of the present invention.

When performing model-based mask writer tuning between different mask writer units, the same process as set forth above in FIG. 1 is utilized. As an example, assuming the to be tuned mask writer is mask writer A and the tuning target is mask writer R, the first step is to print test patterns utilizing nominal mask writer parameters, P, on both mask writer A and mask writer R so as to generate mask data MD_A and MD_R. Then, the mask writer model being utilized is calibrated for mask writer R such that the results of the model accurately correspond to MD_R within some predefined criteria. Next, the non-tunable parameters in the model MP_R are fixed and utilized in the model and the tunable parameters are adjusted such that the results of the model (now referred to as MP_RA) associated with mask writer A correspond to MD_A within some predefined error criteria. Then, in the final step, the parameters of mask writer A, referred to as PA, are tuned from the nominal parameters, P, utilized to produce MD_A to "P+MP_R−MP_RA". FIG. 6 provides a graphical representation of this process. As shown in FIG. 6, the process effectively computes the difference between two models (MP_R and MP_RA) based on parameters associated with the two models (MP_R parameters 602 and MP_RA parameters 604), and then utilizes this computed difference 606 to tune mask writer A by adjusting parameters of mask writer A 608 (P) to parameters 610 (PA).

As an alternative to the foregoing, it is also possible to calibrate the model for mask writer A such that the results of the model accurately correspond to MD_A with some predefined error criteria, and then fix the non-tunable parameters in the model MP_A and utilize these parameters in model MP_AR. The tunable parameters of MP_AR are then adjusted such that the results of the model MP_AR associated with mask writer R correspond to MD_R within some predefined error criteria. Then, in the final step, the parameters of mask writer A, referred to PA, are tuned from the nominal parameters, P, utilized to produce MD_A to "P+MP_AR−MP_A". In yet another variation, it is also possible to utilize an average of the two foregoing processes when determining the amount to tune mask writer A. These processes can also be utilized when tuning mask writers from different manufacturers.

Figure 7:
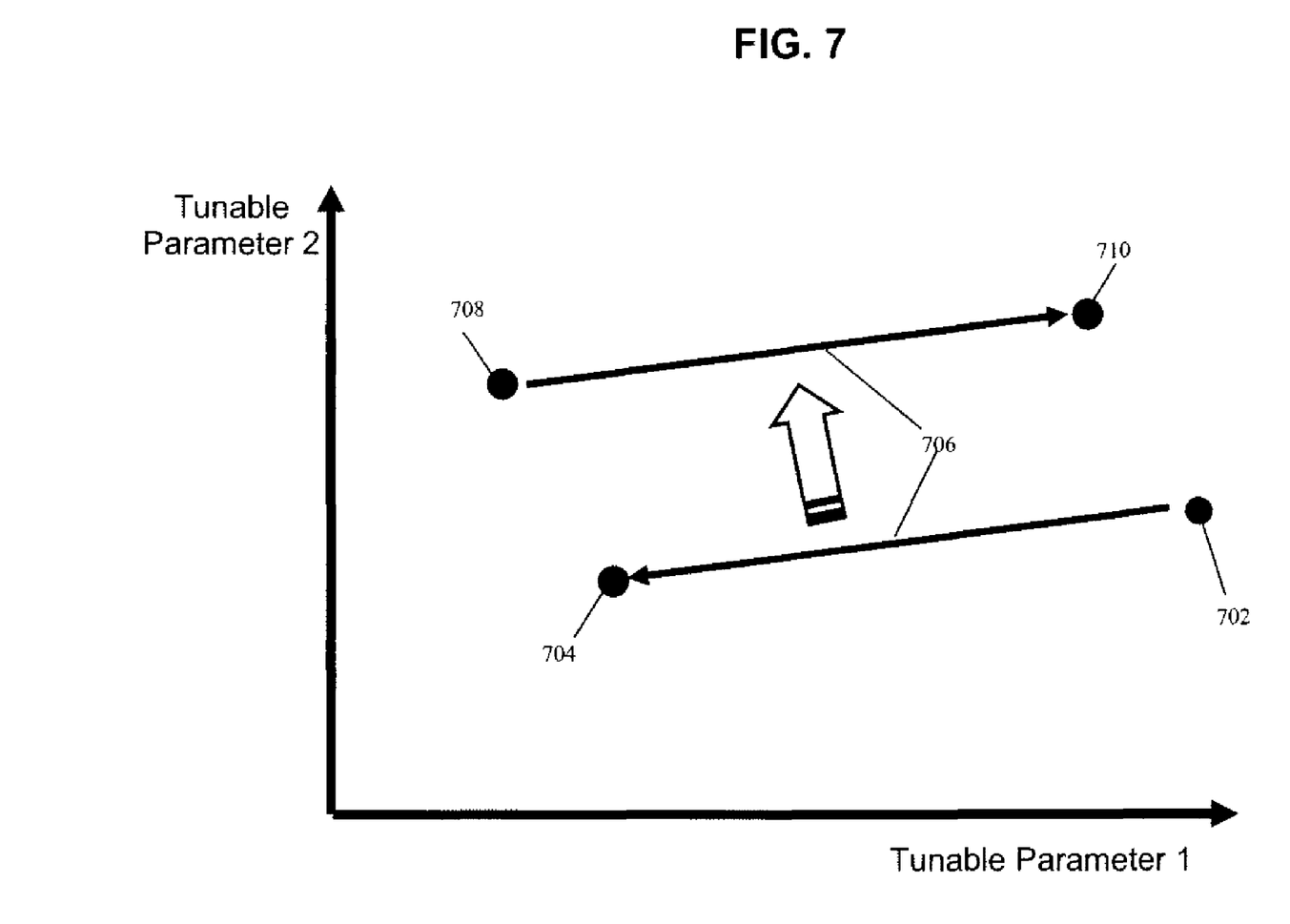
FIG. 7 illustrates a graphical representation of a second embodiment the method of the present invention.

Next, an example is provided of utilizing a virtual mask writer (i.e., model) as the tuning target. The first step in the process is to obtain a known model, referred to as MP_K. Preferably, the model MP_K is calibrated for the given process being utilized and produces results which are within some predefined error criteria. The next step is to print test patterns with the current mask writer C (i.e., the mask writer to be tuned) and measure the resulting mask data, thereby generating data MD_C. Next, all of the non-tunable parameters in model MP_K are fixed and the tunable parameters of model MP_K are adjusted so that the results of the model, now referred to as MP_KC, correspond to MD_C within some predefined error criteria. Then, in the final step of the process, the settings of mask writer C are tuned from the current settings "PC", which were utilized to initial produce MD_C, to "PC+MP_K−MP_KC". This process can be useful for correction of process drift (e.g., source drift) within the mask writer, and well as correction of drift in other mask making process steps (e.g., resist process, etch process, etc.) The process is also useful for optimizing a given mask writer unit for a given MPC (mask proximity correction) process, where the MPC process is effectively incorporated into the model to which the mask writer will be tuned. It is noted that it is possible to utilize an MPC model in the foregoing process as the reference model. A graphical representation of this process is illustrated in FIG. 7. As shown in FIG. 7, the process effectively computes the difference between two models (MP_K and MP_KC) based on parameters associated with the two models (MP_K parameters 702 and MP_KC parameters 704), and then utilizes this computed difference 706 to tune mask writer C by adjusting parameters of mask writer C 708 (PC) to parameters 710.

It is noted that model separability is an important aspect of the model based timing/matching/optimization process disclosed herein. More specifically, when tunable parameters are tuned, the total mask writing behavior can be described accurately by adjusting only the tunable parameters.

In the preceding discussions, the mask writer tuning procedures were based on tuning the tunable parameters of an existing model to fit the target mask data, while allowing only tunable parameters to vary in the fitting/matching process. That means, the non-tunable parameters were determined using only the existing model's data. The above procedure is the choice when data is only available under one condition (e.g., either current writer condition or tuning target condition). However, when mask data is available for both the current writer condition and the tuning target condition, e.g., in the use case of matching between two physical writers without prior model, as an alternative embodiment, it is possible to perform joint calibration on the mask data under both the current writer condition and the target writer condition.

It is further noted that in the joint calibration process mask data can be acquired for patterns printed at different mask writer settings and utilized for calibration. This concept is similar to focus-exposure modeling (e.g., Tachyon FEM) used for lithography modeling, and helps to improve the accuracy and coverage of calibrated model, by jointly fitting to data acquired from different mask writer settings (e.g., dose, eta, etc.). The process requires a physical model so as to obtain the affect of differences in mask writer settings. These differences may take the form of simple physical changes, such as dose, and may also take the form of different algorithm compensations as a result of the mask writer software, such as eta for backward scattering correction. By including data from different eta settings, the mask model calibration can obtain a more accurate characterization of the physical backward scattering effects in the mask writer.

In this alternative process, the non-tunable parameters are also allowed to vary during the calibration process, but are forced to be the same under both conditions, and the tunable parameters are allowed to vary independently under both conditions. After the joint calibration is completed, the difference between the resulting tunable parameters for both conditions is the optimal tuning amount. This method, based on joint calibration, is utilizing the same model-based tuning methodology described above, with the foregoing modification. One advantage of this joint calibration is that it considers mask data from both conditions in determining the non-tunable parameters: current condition and target condition, and therefore can produce slightly more accurate results.

In another variation, it is also possible to perform mask writer tuning utilizing a sensitivity-based tuning process, where "sensitivity" is the first-order derivatives of the model with respect to individual tuning parameters. As such, when a mask model that accurately describes the affect of the physical tunable writer parameters is unavailable, tuning can be achieved through sensitivity measured by experiments as detailed below.

More specifically, in sensitivity-based tuning in accordance with the given embodiment, sensitivity is defined as the first-order derivatives of mask measurements with respect to individual tuning parameters. The behavior of the mask pattern under a small perturbation of physical writer parameters is expected to be linear and can be represented by a simple sum of changes due to each parameter change. The foregoing is clear as it can be shown that the first order Taylor expansion of any multi-variable complex function under a small perturbation is a sum of linear terms:

$$M(x1+Dx1, x2+Dx2, \ldots, xn+Dxn) = M(x1, x2, \ldots, xn) + s1^*Dx1 + s2^*Dx2 + \ldots + sn^*Dxn.$$

The process of performing sensitivity-based tuning of the mask writer is described below. However, first it is necessary to define a number of variables utilized in the process. First, let $x\_i$, $i=1, \ldots, n$, be the nominal setting for mask writer knob i, on the to-be-tuned mask writer, and let $p\_j$, $j=1, \ldots, m$, be the jth test pattern; then $M\_0j$ is the mask measurement for test pattern j under the nominal mask writer settings $\{x\_i\}$. In addition, $M\_ij$ is the mask measurement for test pattern j under the perturbed mask writer settings $\{x\_1, \ldots, x\_i + \Delta x\_i, x\_n\}$.

$S\_ij = (M\_ij - M\_0j)/\Delta x\_i$, and denotes the sensitivity of test pattern j to perturbation of mask writer setting i. $S\_ij$ can be determined, for example, experimentally by physically writing reticles with layout $p\_j$ under all n sets of perturbed settings, plus the nominal setting. Taking a model-centric view-point, the sensitivities $S\_ij$ can be viewed as an empirical and differential model of the mask writer (covering only the neighborhood of the nominal setting in the knob parameter space), for a limited set of patterns. Alternatively, $S\_ij$ may be determined from a simulation, if physical models for the mask writer and metrology tools are available.

Continuing, $T\_j$ is the tuning target for test pattern j. The tuning target $T\_j$ is established with the same metrology tool used for measurements of reticles made from the to-be-tuned mask writer. It is noted that the objective of the mask writer tuning is to determine a suitable set of mask writer knob settings, or a suitable set of perturbations $\Delta x\_i$ to the nominal settings $x\_i$, such that $M\_0j + \Sigma\_i \Delta x\_i \cdot S\_ij$ is close to $T\_j$, preferably within some predefined tolerance.

This objective can be performed by minimizing the cost function:

$$\Sigma\_j w\_j (M\_0j + \Sigma\_i \Delta x\_i \cdot S\_ij - T\_j)^2,$$

where $w\_j$ is a weighting factor for the test pattern j. The minimization is typically constrained to certain range of the perturbations $\Delta x\_i$, and the perturbation range should be smaller than what is allowed by the mask writer unit. Preferably, the perturbation range should also be small enough such that the linearity assumption is valid.

Once the foregoing cost function is minimized, the values of $\Delta x\_i$ corresponding to the minimized cost function (i.e., those values which result in the minimized cost function) are utilized to determine the settings of the tunable parameters of the mask writer unit currently being tuned. More specifically, once the cost function is minimized and the $\Delta x\_i$ values determined, the mask writer can be readily tuned by simply adjusting the nominal values of the tunable parameters by the corresponding values of $\Delta x\_i$.

Variations of the foregoing sensitivity based modeling are also possible, for example, to compensate for possible drift of the metrology tool. In the given variation, the tuning target is deemed to be a physical "golden reticle" (i.e. target mask pattern), and $T\_j$ corresponds to the measurements on the golden reticle before metrology tool drift. These measurements are performed in the same manner as set forth above. However, in addition to the measurements of $T\_j$, after the metrology tool drift, a new set of measurements $T'\_j$ is also performed. Such drift correction may be performed periodically. Measurements for the to-be-tuned mask writer also need to be re-established at nominal settings ($M'\_0j$). Preferably, a new set of perturbed measurements should be performed, leading to a new set of sensitivities $S'\_ij$. Once $S'\_ij$ is determined, the foregoing cost function can once again be minimized so as to determine $\Delta x\_i$, which is then utilized to determine the values of the tuned parameters. It is noted that preferably the cost function would utilize the values associated with $T'\_j$, $M'\_0j$ and $S'\_ij$ during the minimization process. However, the original set of sensitivities $S\_ij$ may also be utilized, because the difference between $S\_ij$ and $S'\_ij$ should be a second-order quantity, which should be small. Utilizing $S\_ij$ will significantly reduce the amount of on-going measurements needed to compensate for metrology tool drift.

It is further noted that there is an assumption that the golden reticle does not change over time. However, in practice, the golden reticle may change due to, for example, charging, crystal growth, hazing, etc. To address this issue, new golden reticles can be generated when necessary.

Finally, it is noted that the mask measurements necessary for the sensitivity-based tuning process discussed (as well as those mask measurements necessary for the model tuning of the first embodiment) can be performed utilizing, for example, CD-SEM (e.g., CD measurements, and extracted mask contours from SEM pictures); optical inspection tools (e.g., images from high resolution inspection tools, such as TeraScan from KLA-Tencor, and images from aerial-image inspection tools, such as AERA from Applied Materials, or aerial image metrology tools, such as AIMS from Zeiss, reconstructed mask contours from the images taken by such optical inspection tools); scatterometry tools (e.g., CD and profile measurements from scatterometry tools, such as 5700-CDRT from n&k Technology, and unprocessed scatterometry data, such as intensity measurements of scattered light); and wafer metrology tools (e.g., the reticle can be used to expose wafers on a lithographic equipment (stepper or scanner), and the exposed wafers can be measured using the wafer metrology tools), or any combination of the foregoing.

As noted above, the model-based mask writer tuning process provides numerous advantages over prior art methods. Most importantly, the present invention provides a systematic and cost effective method for the optimization of mask writing performance and MPE matching between different mask writer units, which are being utilized to generate the same mask. As a result, the present invention readily allows performance matching between different mask writers of the same model as well as for performance matching between different model mask writers.

Advantages associated with the sensitively sensitivity-based tuning process include that the process lowers, or possible eliminates, the requirement of model accuracy or availability. In addition, it allows the use of difficult-to-model metrology tools for tuning measurements (e.g., AERA). Such tools may have advantages, for example, low noise, high repeatability, high speed, or high data volume, etc.

Figure 8:
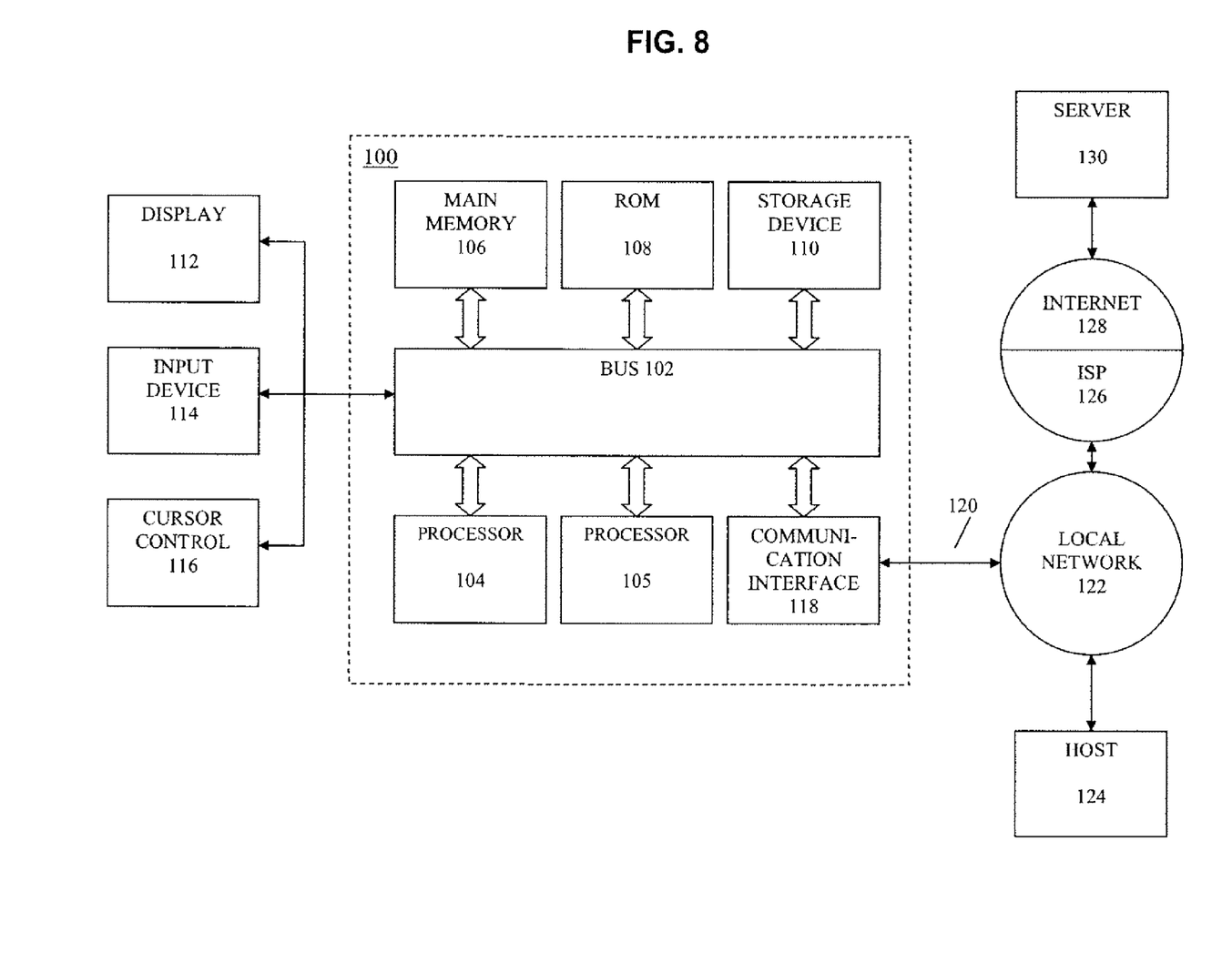
FIG. 8 is a block diagram that illustrates a computer system which can assist in the implementation of the model-based tuning process of the present invention.

FIG. 8 is a block diagram that illustrates a computer system 100 which can assist in the model-based mask writer tuning method disclosed herein. Computer system 100 includes a bus 102 or other communication mechanism for communicating information, and a processor 104 coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, portions of the mask writer unit tuning process, for example, simulation operations, may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions.

The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of tuning a first mask writer unit utilizing a reference mask writer unit, said first mask writer unit and said reference mask writer unit each having tunable parameters for controlling mask writing performance, said method comprising steps of:

defining a test pattern and a mask writing model;
generating said test pattern utilizing said reference mask writer unit and measuring mask writing results;
generating said test pattern utilizing said first mask writer unit and measuring mask writing results;
calibrating said mask writing model utilizing said mask writing results corresponding to said reference mask writer unit, said calibrated mask writing model having a first set of parameter values;
tuning said calibrated mask writing model utilizing said mask writing results corresponding to said first mask writer unit, said tuned calibrated mask writing model having a second set of parameter values; and adjusting said tunable parameters of said first mask writer unit based on a difference between said first set of parameter values and said second set of parameter values.

2. The method of claim 1, wherein said first mask writer unit comprises at least one of an e-beam writer unit and an optical writer unit.

3. The method of claim 1, wherein said mask writing model comprises fixed parameters.

4. The method of claim 1, wherein said tunable parameters of said first mask writer unit correspond to said tunable parameters of said reference mask writer unit.

5. The method of claim 1, wherein said tunable parameters of said first mask writer unit and said reference mask writer unit are set at a nominal value when generating said test pattern.

6. A method of tuning a mask writer unit utilizing a mask writing model, said mask writer unit and said mask writing model each having tunable parameters for controlling mask writing performance, said method comprising steps of:

defining a test pattern;

generating said test pattern utilizing said mask writer unit and measuring mask writing results, said mask writer unit having a first set of parameter values;

tuning said mask writing model utilizing said mask writing results corresponding to said mask writer unit, said tuned mask writing model having a second set of parameter values; and adjusting said tunable parameters of said mask writer unit based on a difference between said first set of parameter values and said second set of parameter values.

7. The method of claim 6, wherein said mask writer unit comprises at least one of an e-beam writer unit and an optical writer unit.

8. The method of claim 6, wherein said mask writing model further comprises fixed parameters.

9. The method of claim 6, wherein said tunable parameters of said mask writer unit correspond to said tunable parameters of said mask writing model.

10. The method of claim 6, wherein said tunable parameters of said mask writer unit are set at a nominal value when generating said test pattern.

* * * * *